US011615947B2

(12) United States Patent
Lariviere et al.

(10) Patent No.: US 11,615,947 B2
(45) Date of Patent: Mar. 28, 2023

(54) SYSTEMS AND METHODS FOR AN IMPROVED MAGNETRON ELECTROMAGNETIC ASSEMBLY

(71) Applicant: OEM Group, LLC, Gilbert, AZ (US)

(72) Inventors: Marc-Andre Lariviere, Mesa, AZ (US); Juan M. Rios Reyes, Exeter, CA (US); Nitin Choudhary, Mesa, AZ (US); Chao Li, Chandler, AZ (US); Brendan V. Trang, La Puente, CA (US); Christian K. Forgey, Round Rock, TX (US); Michael S. Correra, Staten Island, NY (US); William W. Senseman, Chandler, AZ (US)

(73) Assignee: OEM Group, LLC, Gilbert, AZ (US)

( * ) Notice: Subject to any disclaimer, the term of this patent is extended or adjusted under 35 U.S.C. 154(b) by 0 days.

(21) Appl. No.: 17/408,221

(22) Filed: Aug. 20, 2021

(65) Prior Publication Data

US 2022/0068620 A1 Mar. 3, 2022

Related U.S. Application Data

(60) Provisional application No. 63/073,206, filed on Sep. 1, 2020.

(51) Int. Cl.
*H01J 37/34* (2006.01)
*C23C 14/35* (2006.01)
(Continued)

(52) U.S. Cl.
CPC ...... *H01J 37/3458* (2013.01); *C23C 14/3407* (2013.01); *C23C 14/352* (2013.01);
(Continued)

(58) Field of Classification Search
CPC .............. H01J 37/3458; H01J 37/3417; H01J 37/3405; H01J 37/3435; H01J 37/3452;
(Continued)

(56) References Cited

U.S. PATENT DOCUMENTS

| 4,865,710 A | 9/1989 | Aaron et al. |
| 7,846,310 B2 * | 12/2010 | Gillard .............. H01J 37/32623 204/298.31 |

(Continued)

FOREIGN PATENT DOCUMENTS

JP H0881769 3/1996

OTHER PUBLICATIONS

Mishin Sergey et al: "Manufacturing of highly doped aluminum nitride films", 2015 Joint Conference of the IEEE International Frequency Control Symposium & The European Frequency and Time Forum, IEEE, Apr. 12, 2015, pp. 777-782.

*Primary Examiner* — Michael A Band
(74) *Attorney, Agent, or Firm* — Harvey S. Kauget; Burr & Forman LLP

(57) ABSTRACT

The present invention provides a magnetron system, comprising a baseplate assembly. The baseplate assembly defining a housing portion and a power feedthrough. A sputtering target is disposed within the housing portion of the baseplate assembly. An electromagnetic assembly is disposed within the housing portion of the baseplate assembly. The electromagnetic assembly comprising a plurality of electromagnet pairs and a plurality of magnet pairs, wherein the plurality of electromagnet pairs and the plurality of magnet pairs are arranged in an alternating order such that at least one electromagnet pair of the plurality of electromagnet pairs is juxtapositioned between two magnet pairs of the plurality of magnet pairs, and at least one magnet pair of the plurality of (Continued)

magnet pairs is juxtapositioned between two electromagnet pairs of the plurality of electromagnet pairs.

3 Claims, 14 Drawing Sheets

(51) Int. Cl.
    *C23C 14/34*     (2006.01)
    *H01F 7/20*     (2006.01)

(52) U.S. Cl.
    CPC ............ *H01F 7/20* (2013.01); *H01J 37/3405* (2013.01); *H01J 37/345* (2013.01); *H01J 37/3417* (2013.01); *H01J 37/3435* (2013.01); *H01J 37/3452* (2013.01); *H01J 37/3414* (2013.01); *H01J 37/3441* (2013.01)

(58) Field of Classification Search
    CPC .. H01J 37/3414; H01J 37/3441; H01J 37/345; H01J 37/3423; C23C 14/3407; C23C 14/352; C23C 14/35

See application file for complete search history.

(56) References Cited

U.S. PATENT DOCUMENTS

| | | | |
|---|---|---|---|
| 8,398,834 B2 | 3/2013 | Hollars | |
| 8,778,151 B2* | 7/2014 | Ikeda | H01J 37/32091 |
| | | | 204/298.11 |
| 9,607,813 B2 | 3/2017 | Sasaki et al. | |
| 2004/0163952 A1* | 8/2004 | Oshmyansky | H01J 37/3408 |
| | | | 204/298.18 |
| 2006/0207873 A1 | 9/2006 | Fu | |
| 2007/0261957 A1* | 11/2007 | Takahashi | H01J 37/3423 |
| | | | 204/298.16 |
| 2008/0141939 A1 | 6/2008 | Gillard et al. | |
| 2009/0314631 A1 | 12/2009 | Bernick et al. | |
| 2022/0051952 A1* | 2/2022 | Cheng | H01J 37/3458 |

\* cited by examiner

SYSTEMS AND METHODS FOR AN IMPROVED MAGNETRON ELECTROMAGNETIC ASSEMBLY

CROSS REFERENCES TO RELATED APPLICATIONS

This application claims priority from and is related to commonly owned U.S. Provisional Patent Application Ser. No. 63/073,206 filed Sep. 1, 2020, entitled: SYSTEMS AND METHODS FOR AN IMPROVED MAGNETRON ELECTROMAGNETIC ASSEMBLY, this Provisional Patent Application incorporated by reference herein.

FIELD OF THE INVENTION

The present disclosure generally relates to physical vapor deposition, and in particular, to a system and associated method for an improved electromagnet assembly for use within a magnetron.

BACKGROUND OF THE INVENTION

Sputtering is often used for physical vapor deposition of materials onto arbitrary wafers. Sputtering occurs when microscopic molecules are eroded from a solid target surface after being bombarded with energized ions of plasma or gas. In wafer manufacturing, this process is used to deposit uniform microscopic films onto a wafer. Typically, eroded material from the target surface is deposited onto the wafer. For instance, to deposit an aluminum film onto a silicon wafer, the target surface would be aluminum.

In a magnetron, plasma is created by ionizing a non-reactive gas, typically Argon (Ar) by low-pressure separation of positively charged ions from negatively charged electrons. The positively charged ions are accelerated towards a negatively charged electrode, i.e., the target surface, and strike the negatively charged electrode with enough force to dislodge and eject molecules from the target surface. Such molecules then condense onto the wafer which is placed in proximity to a magnetron sputtering cathode. To deposit compound materials onto wafer surface, a reactive gas is introduced into the Ar gas plasma. For example, nitrogen gas is used with Argon to deposit AlN films from an Al target.

Common issues in the art include non-uniformity of film deposition onto the wafer, which can lead to quality degradation and inconsistency of the finished product. Non-uniformity of films can be caused by aberrations in electromagnetic field, as well as gradual erosion of the target surface over time. Further, with the advent of scandium-doped aluminum nitride films, it is necessary to compensate for differences in sputtering rates between different sputtering materials.

Nothing in the prior art provides the benefits attendant with the present invention.

Therefore, it is an object of the present invention to provide an improvement which overcomes the inadequacies of the prior art devices and which is a significant contribution to the advancement of using a magnetron system.

Another object of the present invention is to provide a magnetron system, comprising a baseplate assembly, the baseplate assembly defining a housing portion and a power feedthrough; a sputtering target disposed within the housing portion of the baseplate assembly; and an electromagnetic assembly, the electromagnetic assembly being disposed within the housing portion of the baseplate assembly and comprising a plurality of electromagnet pairs and a plurality of magnet pairs, wherein the plurality of electromagnet pairs and the plurality of magnet pairs are arranged in an alternating order such that at least one electromagnet pair of the plurality of electromagnet pairs is juxtapositioned between two magnet pairs of the plurality of magnet pairs, and at least one magnet pair of the plurality of magnet pairs is juxtapositioned between two electromagnet pairs of the plurality of electromagnet pairs.

Yet another object of the present invention is to provide a magnetron system, comprising a baseplate assembly, the baseplate assembly defining a housing portion and a power feedthrough; a sputtering target disposed within the housing portion of the baseplate assembly; and an electromagnetic assembly, the electromagnetic assembly being disposed within the housing portion of the baseplate assembly and comprising a plurality of electromagnet pairs and a plurality of magnet pairs, wherein at least one electromagnet pair of the plurality of electromagnet pairs and at least one magnet pair of the plurality of magnet pairs are arranged in an alternating order such that at least one electromagnet pair of the plurality of electromagnet pairs is juxtapositioned between two magnet pairs of the plurality of magnet pairs, and at least one magnet pair of the plurality of magnet pairs is juxtapositioned between two electromagnet pairs of the plurality of electromagnet pairs.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The invention described herein provides systems and methods for an improved magnetron electromagnetic assembly.

A feature of the present invention is to provide a magnetron system, comprising a baseplate assembly. The baseplate assembly defining a housing portion and a power feedthrough. A sputtering target is disposed within the housing portion of the baseplate assembly. An electromagnetic assembly is disposed within the housing portion of the baseplate assembly. The electromagnetic assembly comprising a plurality of electromagnet pairs and a plurality of magnet pairs, wherein the plurality of electromagnet pairs and the plurality of magnet pairs are arranged in an alternating order such that at least one electromagnet pair of the plurality of electromagnet pairs is juxtapositioned between two magnet pairs of the plurality of magnet pairs, and at least one magnet pair of the plurality of magnet pairs is juxtapositioned between two electromagnet pairs of the plurality of electromagnet pairs. The electromagnetic assembly can further comprise an outer electromagnetic assembly comprising a first grouping of the plurality of magnet pairs and a first grouping of the plurality of electromagnet pairs and an inner electromagnetic assembly comprising a second grouping of the plurality of magnet pairs and a second grouping of the plurality of electromagnet pairs. The inner electromagnetic assembly can be positioned underneath the outer electromagnetic assembly. The outer electromagnetic assembly can be encased in resin and the inner electromagnetic assembly can be encased in resin. The system can further comprise a water jacket assembly, wherein the water jacket assembly comprises an outer water jacket disposed within an outer electromagnetic assembly of the electromagnetic assembly and an inner water jacket disposed within an inner electromagnetic assembly of the electromagnetic assembly. At least one magnet pair of the plurality of magnet pairs can have a vertical magnet and a horizontal magnet wherein the vertical magnet can be aligned with an axis Z and the horizontal magnet can be aligned perpendicular to the vertical magnet. At least one electromagnet pair of the plurality of electromagnet pairs can have a vertical electromagnet and a horizontal electromagnet, the vertical electromagnet can be aligned with an axis Z and the horizontal electromagnet can be aligned perpendicular to the vertical electromagnet. The plurality of electromagnet pairs can further comprise a ferromagnetic core and a conductive wire, the conductive wire wrapped around the ferromagnetic core in a coil configuration wherein the conductive wire is in electrical communication with the power feedthrough of the baseplate assembly such that power is delivered to each conductive wire of the plurality of electromagnet pairs, wherein each electromagnet pair contributes to an overall magnetic field generated by the magnetron system. The sputtering target can comprise an outer target and an inner target. The outer target and the inner target can be electrically isolated from one another by an annular target shield.

Another feature of the present invention is to provide a magnetron system, comprising a baseplate assembly. The baseplate assembly defining a housing portion and a power feedthrough. A sputtering target is disposed within the housing portion of the baseplate assembly. An electromagnetic assembly is disposed within the housing portion of the baseplate assembly and comprising a plurality of electromagnet pairs and a plurality of magnet pairs, wherein at least one electromagnet pair of the plurality of electromagnet pairs and at least one magnet pair of the plurality of magnet pairs are arranged in an alternating order such that at least one electromagnet pair of the plurality of electromagnet pairs is juxtapositioned between two magnet pairs of the plurality of magnet pairs, and at least one magnet pair of the plurality of magnet pairs is juxtapositioned between two electromagnet pairs of the plurality of electromagnet pairs. The electromagnetic assembly can further comprise an outer electromagnetic assembly comprising a first grouping of the plurality of magnet pairs and a first grouping of the plurality of electromagnet pairs and an inner electromagnetic assembly comprising a second grouping of the plurality of magnet pairs and a second grouping of the plurality of electromagnet pairs. The inner electromagnetic assembly can be positioned underneath the outer electromagnetic assembly. The outer electromagnetic assembly can be encased in resin and the inner electromagnetic assembly can be encased in resin. The system can further comprise a water jacket assembly, wherein the water jacket assembly comprises an outer water jacket disposed within an outer electromagnetic assembly of the electromagnetic assembly and an inner water jacket disposed within an inner electromagnetic assembly of the electromagnetic assembly. At least one magnet pair of the plurality of magnet pairs can have a vertical magnet and a horizontal magnet wherein at least one vertical magnet can be aligned with an axis Z and at least one horizontal magnet can be aligned perpendicular to at least one vertical magnet. At least one electromagnet pair of the plurality of electromagnet pairs can have a vertical electromagnet and a horizontal electromagnet, at least one vertical electromagnet can be aligned with an axis Z and at least one horizontal electromagnet can be aligned perpendicular to at least one vertical electromagnet. The plurality of electromagnet pairs can further comprise a ferromagnetic core and a conductive wire, the conductive wire wrapped around the ferromagnetic core in a coil configuration wherein the conductive wire is in electrical communication with the power feedthrough of the baseplate assembly such that power is delivered to each conductive wire of the plurality of electromagnet pairs, wherein each electromagnet pair contributes to an overall magnetic field generated by the magnetron system. The sputtering target can comprise an outer target and an inner target. The outer target and the inner target can be electrically isolated from one another by an annular target shield.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Corresponding reference characters indicate corresponding elements among the view of the drawings. The headings used in the figures do not limit the scope of the claims.

DETAILED DESCRIPTION OF THE INVENTION

Figure 1:
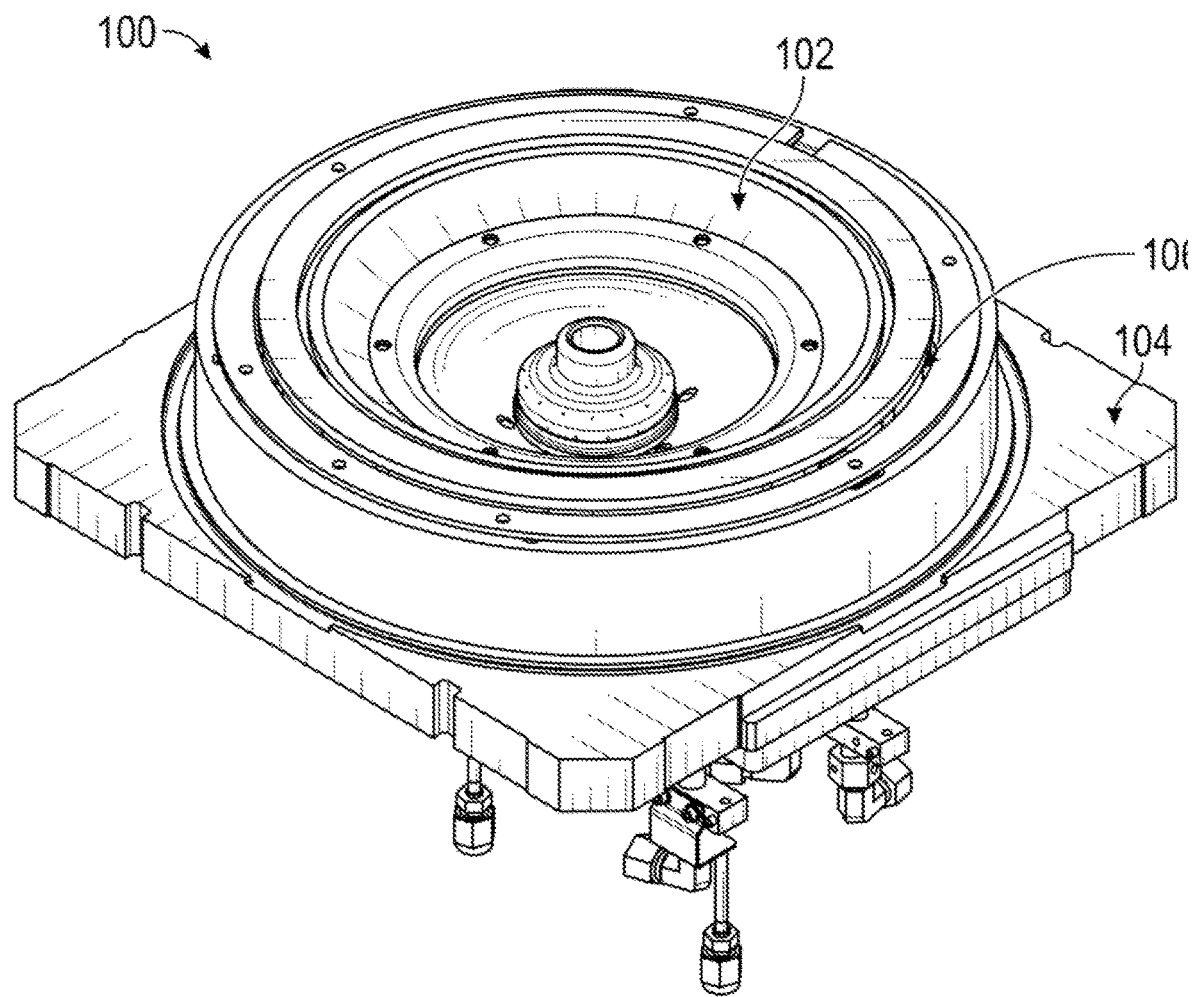
FIG. 1 is a perspective view of a magnetron system.

Various embodiments of a system and associated method for a magnetron featuring an improved electromagnetic assembly for producing uniform physical vapor deposition films on an electronic wafer are disclosed herein. The electromagnetic assembly includes a plurality of magnet pairs and a plurality of electromagnet pairs arranged in inner and outer groupings for inducing a controlled electromagnetic field within a batch processing chamber. In some embodiments, power can be individually applied to each electromagnet pair to modulate an effect that each electromagnet pair has on the overall electromagnetic field within the batch processing chamber. The power individually applied to each electromagnetic pair can be increased or decreased in order to maintain precise control of material deposition onto a surface of the electronic wafer. In some embodiments, the electromagnetic assembly is encased in an ultra-high vacuum (UHV) compatible epoxy-resin for structural support. Referring to the drawings, embodiments of a magnetron system featuring an improved electromagnetic assembly are illustrated and generally indicated as 100 in FIGS. 1-17.

Figure 2:
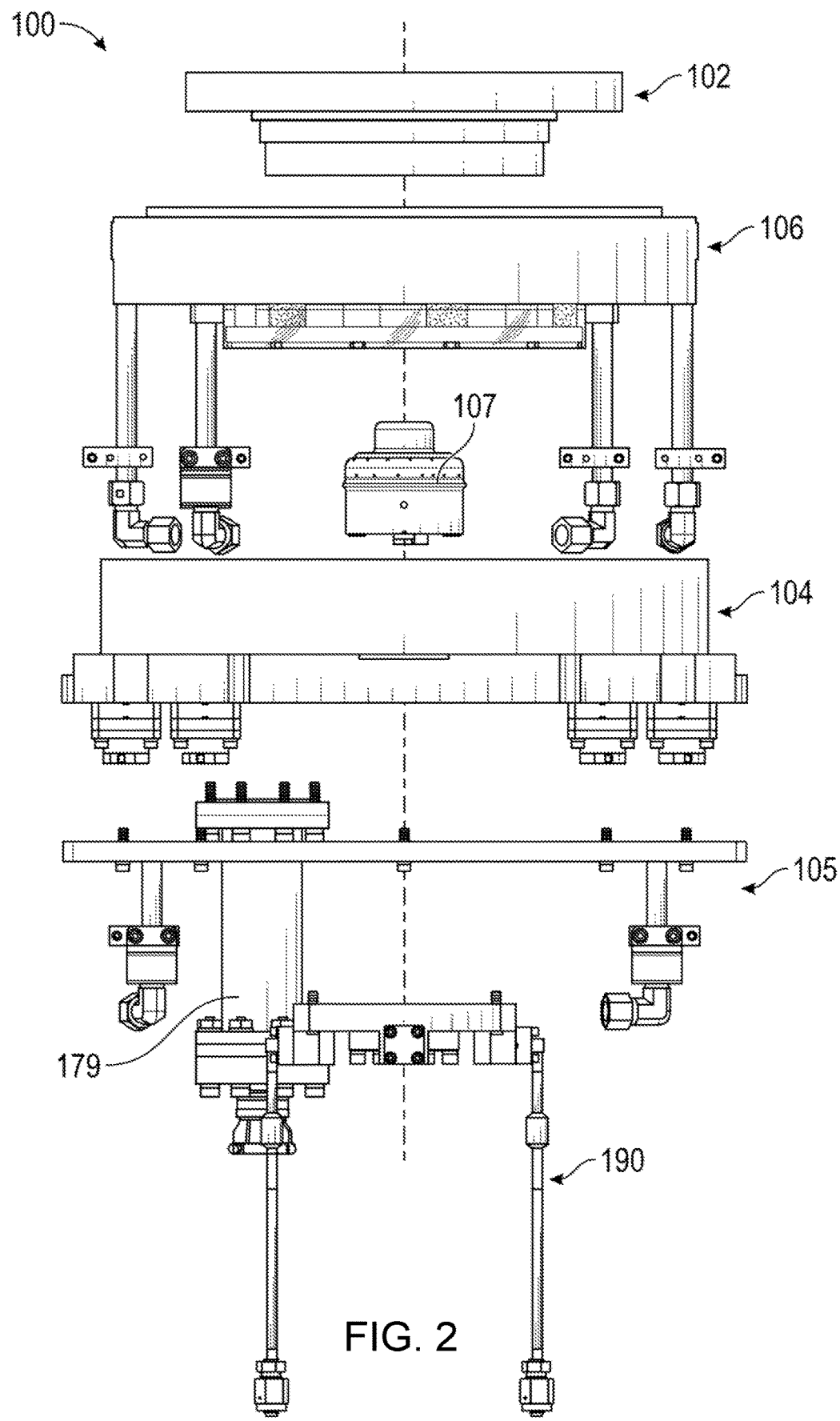
FIG. 2 is an exploded view of the magnetron system of FIG. 1.
Figure 3:
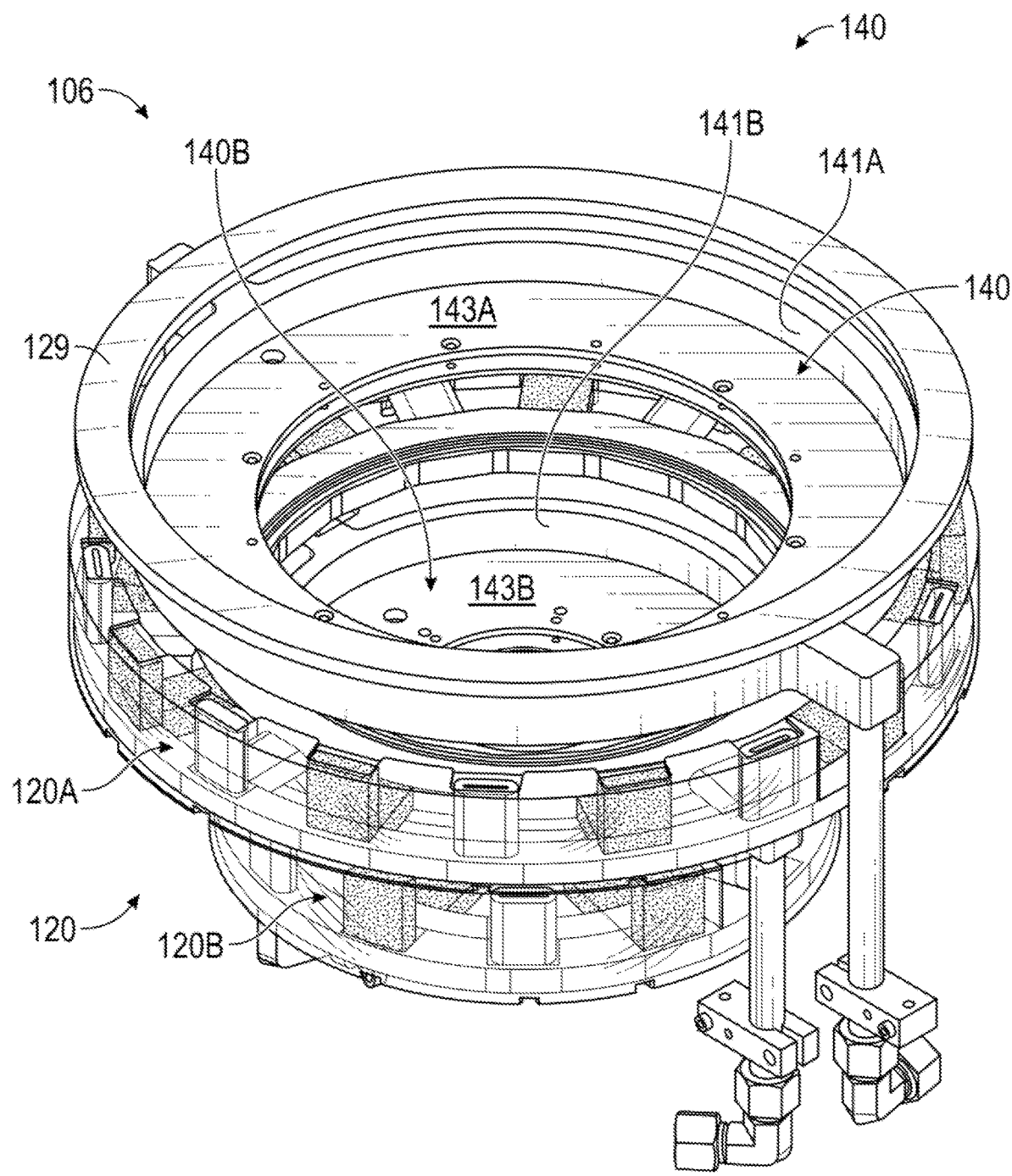
FIG. 3 is an exploded perspective view of an internal assembly of the magnetron system of FIG. 1.
Figure 8:
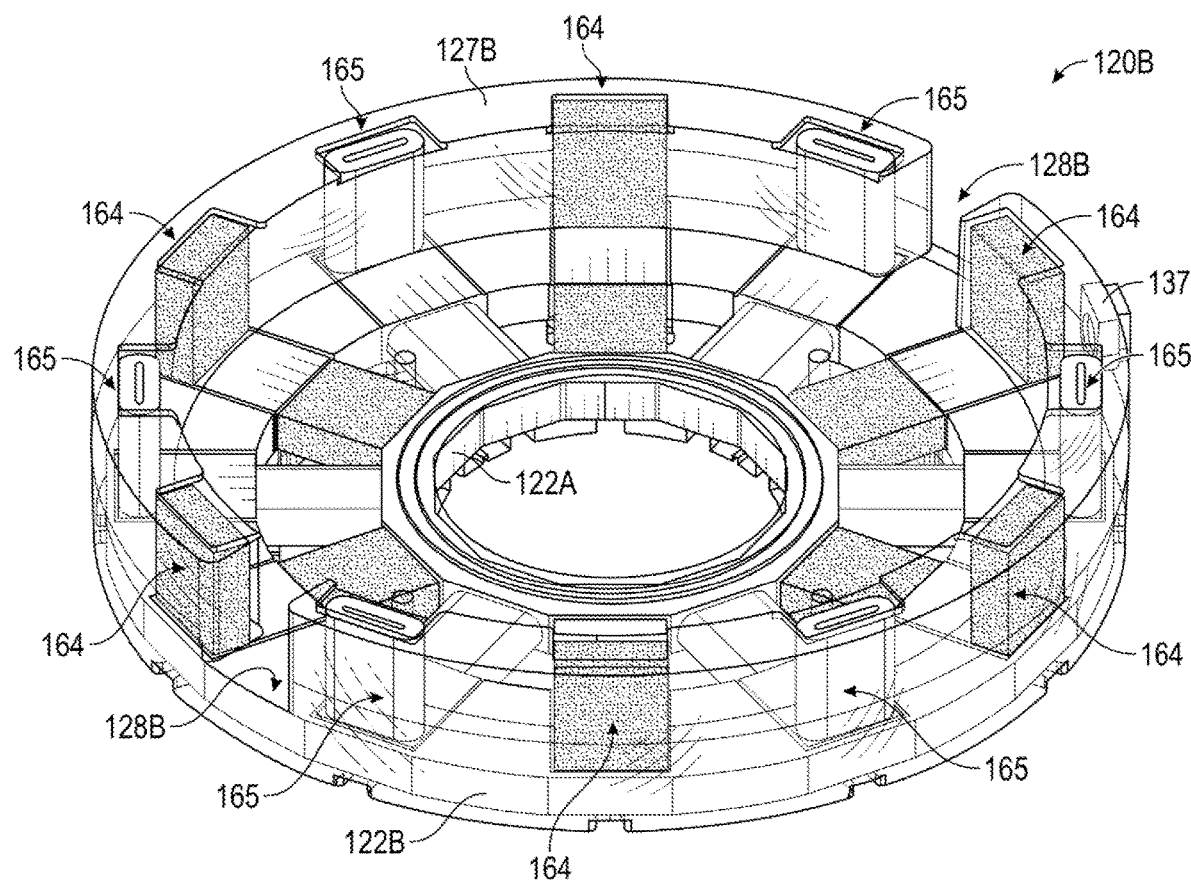
FIG. 8 is a perspective view of the inner magnet assembly of FIG. 4.

Referring to FIGS. 1 and 2, the magnetron system 100 is shown having a baseplate assembly 104 and a negatively charged sputtering target 102 with the sputtering target 102 resting within the baseplate assembly 104. The magnetron system 100 further includes an internal assembly 106 situated directly beneath the sputtering target 102, the internal assembly 106 further including an electromagnetic assembly 120 (FIG. 3) and a water jacket assembly 140 (FIG. 3). The electromagnetic assembly 120 enables precise control of the magnetic field at the sputtering target 102 such that electrons are confined to the surface of the negatively charged sputtering target 102. The electrons attract positively charged gas ions towards the sputtering target 102 such that molecules are ejected from the sputtering target 102 and adhere to the wafer. Control of the magnetic field by the electromagnetic assembly 120 enables confinement of the electrons to particular areas of the sputtering target 102, thus enabling control of the sputtering process. In some embodiments, the electromagnetic assembly 120 is encased in a resin casing 127A (FIG. 5) and 127B (FIG. 8). As shown, the baseplate assembly 104 further includes a gas tower 107 (FIG. 2) extending through respective centers of the internal assembly 106 and the sputtering target 102 as well as a power feedthrough 179 for providing power to the electromagnetic assembly 120 while under ultra-high vacuum. The magnetron system 100 further includes a cooling plate 105 for cooling the power feedthrough 179 and the baseplate assembly 104 positioned underneath the internal assembly 106. In addition, a gas distribution assembly 190 is in fluid flow communication with the gas tower 107 when the magnetron system 100 is assembled for introducing an inert gas into the batch processing chamber (not shown).

Figure 4:
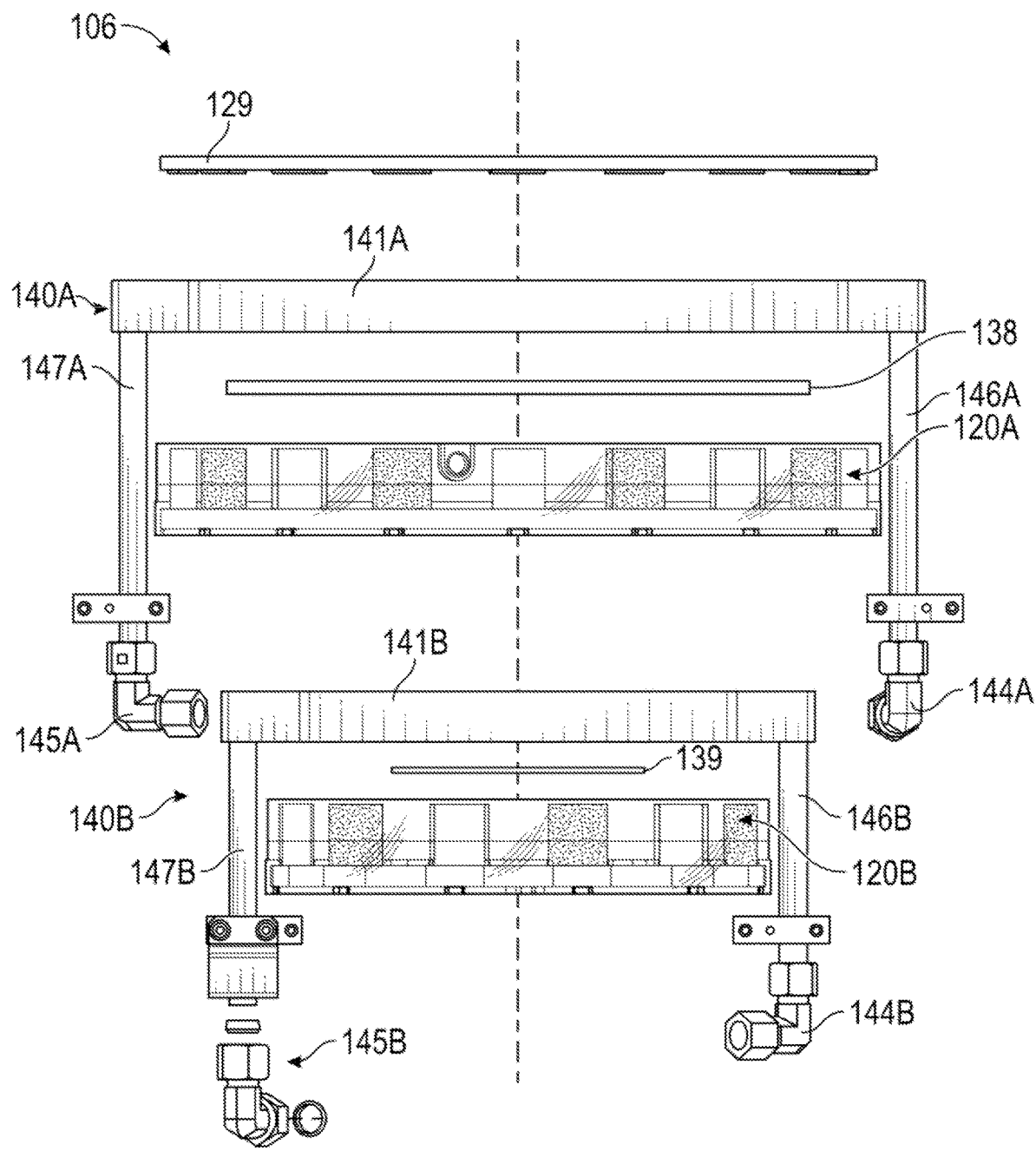
FIG. 4 is an exploded side view of the internal assembly of FIG. 3 featuring an outer magnet assembly and an inner magnet assembly.

As shown in FIGS. 2 and 3, the internal assembly 106 is positioned directly below the sputtering target 102 for generating the controlled electromagnetic field within the batch processing chamber to accelerate positively charged ions towards the sputtering target 102. The internal assembly 106 includes the electromagnetic assembly 120 and the water jacket assembly 140. As shown, the electromagnetic assembly 120 includes an outer electromagnetic assembly 120A and an inner electromagnetic assembly 120B. Similarly, the water jacket assembly 140A includes an outer water jacket assembly 140A and an inner water jacket assembly 140B, the outer water jacket assembly 140A resting inside the outer electromagnetic assembly 120A and the inner water jacket assembly 140B resting inside the inner electromagnetic assembly 120B. Referring to FIG. 4, the internal assembly 106 includes an outer backplate 138 positioned between the outer water jacket 140A and the outer electromagnetic assembly 120A, while an inner backplate 139 is similarly located between the inner water jacket 140A and the inner electromagnetic assembly 120B. The water jacket assembly 140 further includes inlet tubes 146A and 146B and outlet tubes 147A and 147B which respectively terminate in inlet ports 144A and 144B and outlet ports 145A and 145B for piping coolant in and out of the water jacket assembly 140. As shown, the inlet tube 146A, outlet tube 147A, inlet port 144A and outlet port 145A correspond to the outer water jacket 140A, while the inlet tube 146B, outlet tube 147B, inlet port 144B and outlet port 145B correspond to the inner water jacket 140B.

Figure 5:
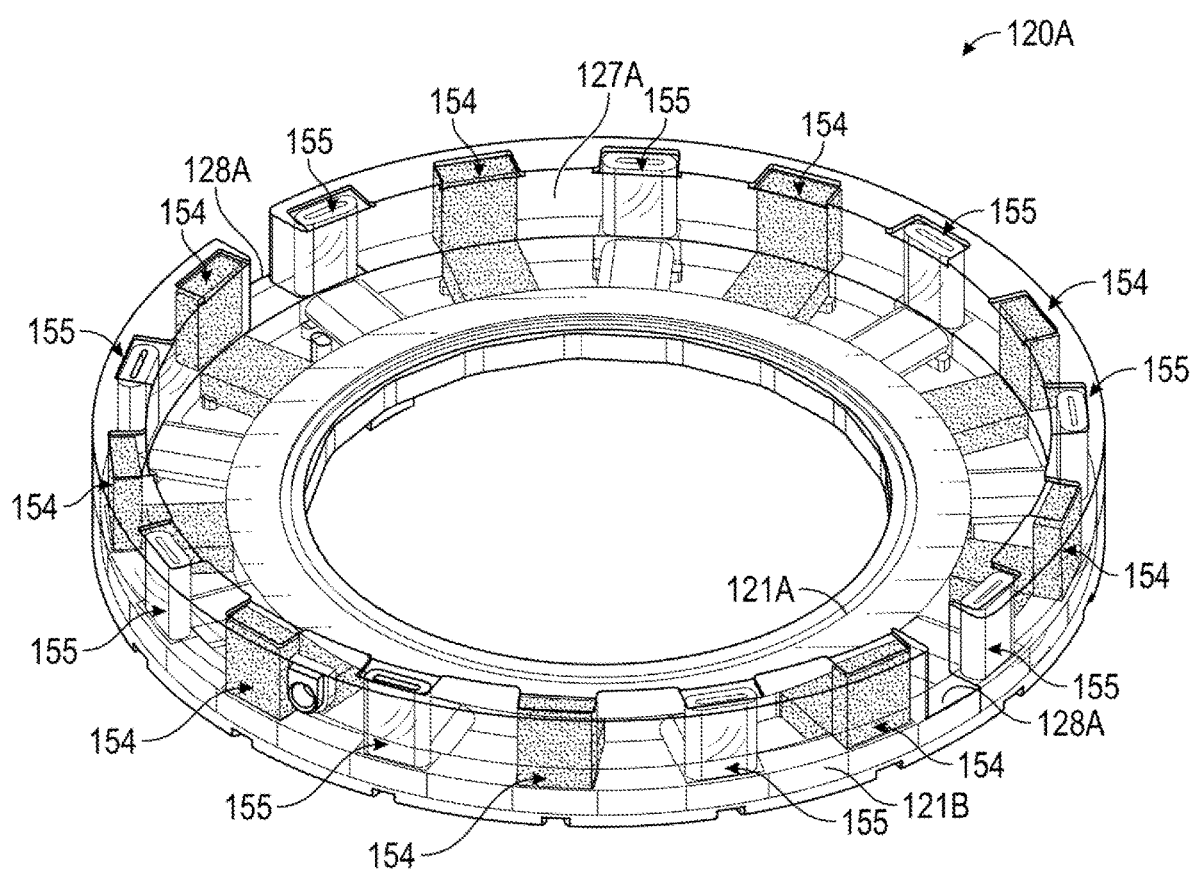
FIG. 5 is a perspective view of the outer magnet assembly of FIG. 4.
Figure 6:
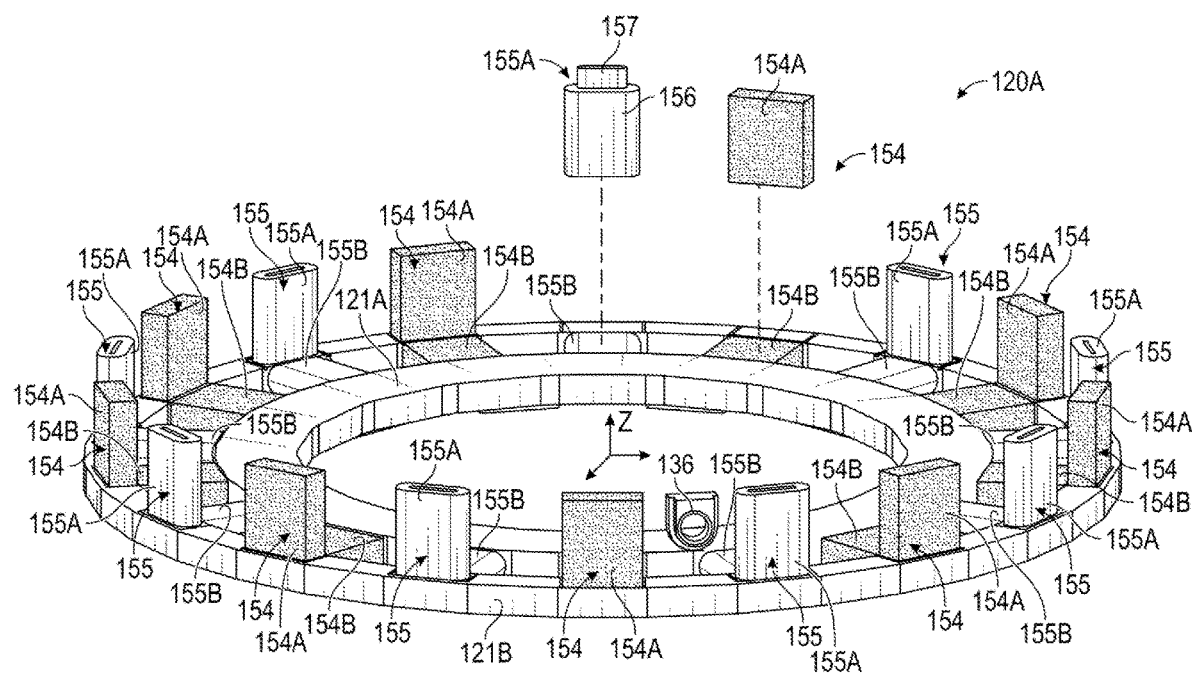
FIG. 6 is a perspective view of the outer magnet assembly of FIG. 5 showing a detached electromagnet and a detached magnet.
Figure 7:
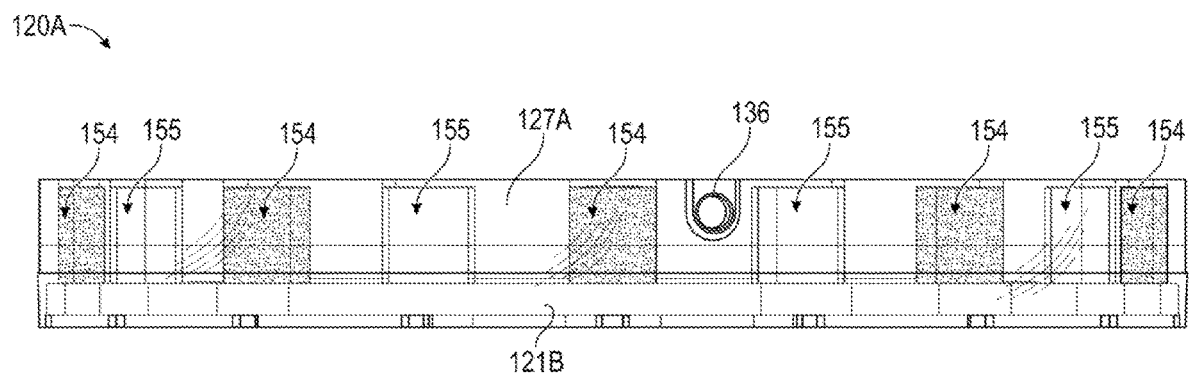
FIG. 7 is a side view of the outer magnet assembly of FIG. 4.

Referring directly to FIGS. 5-7, the outer electromagnetic assembly 120A forms a part of the electromagnetic assembly 120 (FIG. 3) that defines a plurality of magnet pairs 154 and a plurality of electromagnet pairs 155 that can be arranged around a first inner pole piece 121A. As shown, at least one magnet pair 154 includes a vertical magnet 154A (FIG. 6) that can be aligned along a vertical axis Z (FIG. 6) and a horizontal magnet 154B (FIG. 6) oriented perpendicular to the vertical magnet 154A along vertical axis Z. Similarly, at least one electromagnet pair 155 includes a vertical electromagnet 155A (FIG. 6) that can be aligned with the vertical axis Z (FIG. 6) and a horizontal electromagnet 154B (FIG. 6) oriented perpendicular to the vertical electromagnet 155A and the vertical axis Z. As shown, at least one horizontal magnet 154B and horizontal electromagnet 155B are surrounded by a first outer pole piece 121B. At least one vertical magnet 154A and vertical electromagnet 155A rest atop or are otherwise engaged with the first outer pole piece 121B, as shown in FIG. 6. In one aspect, the magnet pairs 154 and the electromagnet pairs 155 are arranged in an alternating sequence such that at least one magnet pair 154 is juxtapositioned between two electromagnet pairs 155, and at least one electromagnet pair 155 is juxtapositioned between two magnet pairs 154, respectively. In some embodiments, the outer electromagnetic assembly 120A includes nine magnet pairs 154 and nine electromagnet pairs 155, however other embodiments may vary in the amount of magnet pairs 154 and electromagnet pairs 155 employed. In some embodiments, the outer electromagnetic assembly 120A is encased in a resin casing 127A to prevent the contents from shifting or being otherwise disturbed. The resin casing 127A is preferably made of a non-conductive material and capable of withstanding an ultra-high vacuum. In some embodiments, the resin casing 127A is an epoxy-resin. An outer power aperture 136 (FIG. 6) is further included within the outer electromagnetic assembly 120A for introduction of one or more conductive elements (not shown) to provide power to each electromagnet pair 155.

Figure 9:
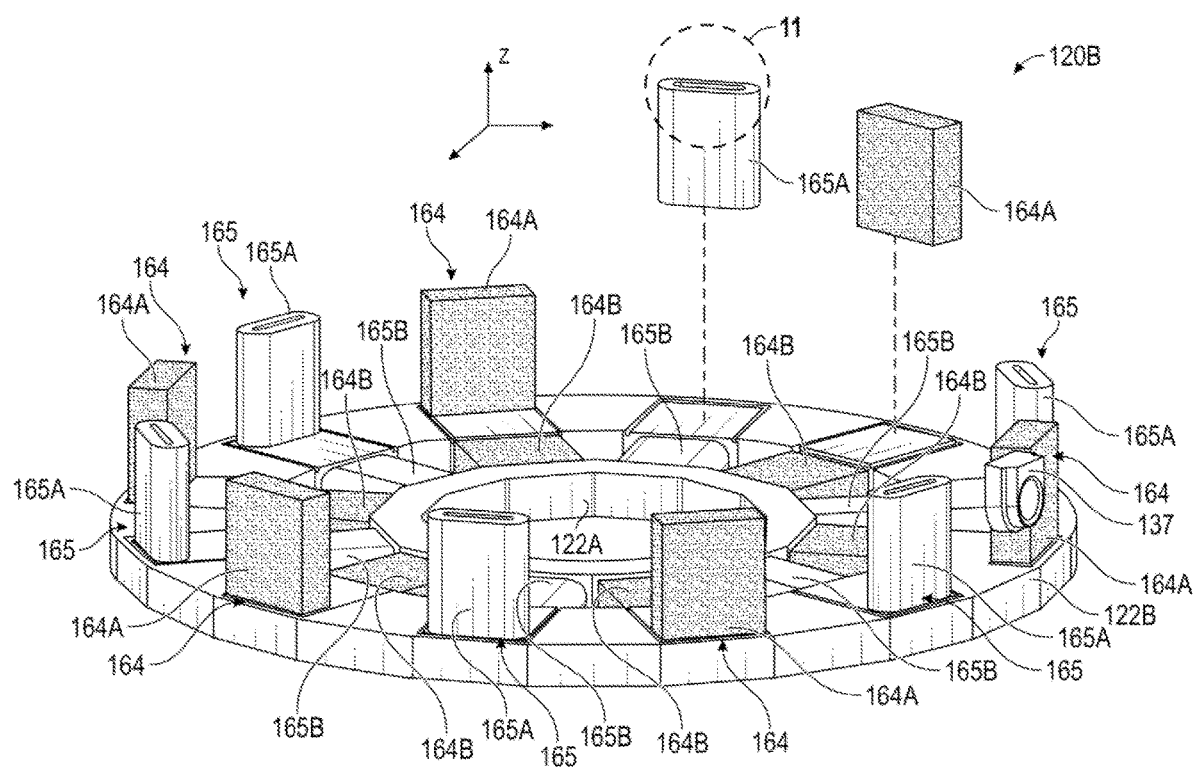
FIG. 9 is a perspective view of the inner magnet assembly of FIG. 8 showing a detached electromagnet and a detached magnet.
Figure 10:
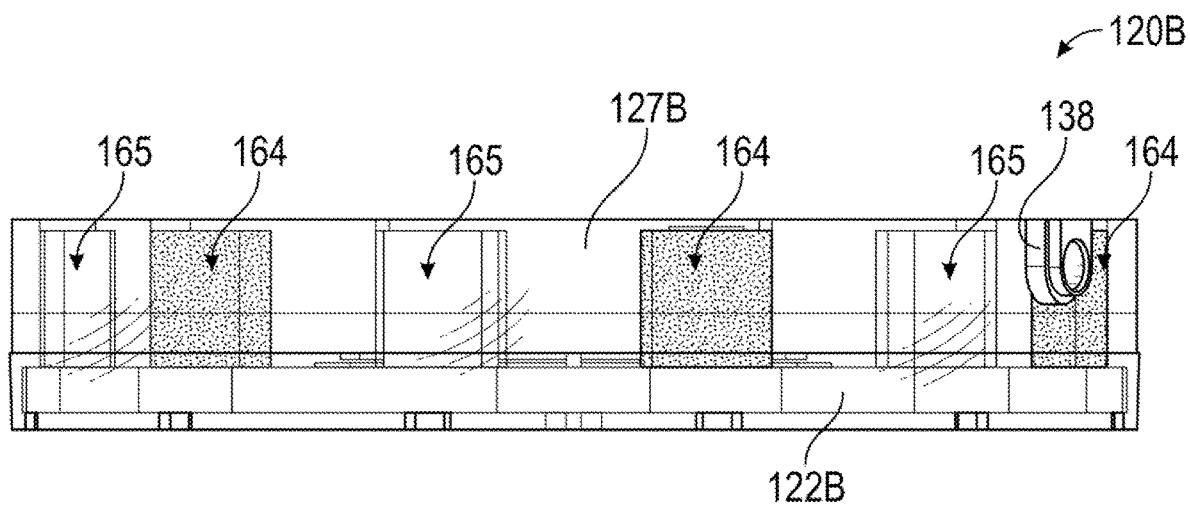
FIG. 10 is a side view of the inner magnet assembly of FIG. 8.

Similarly, as shown in FIGS. 8-10, the inner electromagnetic assembly 120B forms a part of the electromagnetic assembly 120 (FIG. 3) and defines a plurality of magnet pairs 164 and a plurality of electromagnet pairs 165 that can be arranged around a second inner pole piece 122A. As specifically shown in FIG. 3, the inner electromagnetic assembly 120B is positioned underneath the outer electromagnetic assembly 120A. At least one magnet pair 164 includes a vertical magnet 164A (FIG. 9) that can be aligned along vertical axis Z (FIG. 9) and a horizontal magnet 164B (FIG. 9) oriented perpendicular to the vertical magnet 164A along vertical axis Z. Similarly, at least one electromagnet pair 165 includes a vertical electromagnet 165A (FIG. 9) that can be aligned along vertical axis Z and a horizontal electromagnet 164B (FIG. 9) oriented perpendicular to the vertical electromagnet 165A along vertical axis Z. As shown, at least one horizontal magnet 164B and horizontal electromagnet 165B are surrounded by a second outer pole piece 122B. At least one vertical magnet 164A and vertical electromagnet 165A rest atop or are otherwise engaged with the second outer pole piece 122B, as shown in FIG. 9. In some embodiments, a difference between an inner radius and an outer radius of the second outer pole piece 122B of the inner electromagnetic pack 120B may be larger than a difference between an inner radius and an outer radius of the first outer pole piece 121B (FIG. 6) of the outer electromagnetic pack 120A in order to space the horizontal electromagnets 165B and horizontal magnets 164B away from the vertical electromagnets 165A and vertical magnets 164A to better shape the electromagnetic field. The magnet pairs 164 and the electromagnet pairs 165 are arranged in an alternating sequence such that at least one magnet pair 164 is juxtapositioned between two electromagnet pairs 165, and at least one electromagnet pair 165 is juxtapositioned between two magnet pairs 164, respectively. In some embodiments, the inner electromagnetic assembly 120B includes six magnet pairs 164 and six electromagnet pairs 165, however other embodiments may vary in the amount of magnet pairs 164 and electromagnet pairs 165 employed. In some embodiments, the inner electromagnetic assembly 120B is encased in a resin casing 127B (FIG. 8) to prevent the contents from shifting or being otherwise damaged or disturbed. The resin casing 127B is preferably a non-conductive material which is capable of withstanding an ultra-high vacuum. In some embodiments, the resin casing 127B is an epoxy-resin. An inner power aperture 137 (FIG. 9) is further included within the inner electromagnetic assembly 120B for introduction of one or more conductive elements (not shown) to provide power to each electromagnet pair 165.

In some embodiments, as shown in FIGS. 5 and 8, the electromagnetic assembly 120 defines a magnetic circuit which is completed by a magnetic connection between components of the outer electromagnetic assembly 120A and the inner electromagnetic assembly 120B. As discussed above, the first outer pole piece 121B completes a magnetic connection between a vertically oriented magnet 154A and a vertically oriented electromagnet 155A with a horizontally oriented magnet 154B and a horizontally oriented electromagnet 155B of the outer electromagnetic assembly 120A. The first inner pole piece 121A connects components of the outer electromagnetic assembly 120A with components of the inner electromagnetic assembly 120B. In particular, the first inner pole piece 121A completes a magnetic connection of a horizontally oriented magnet 154B and a horizontally oriented electromagnet 155B of the outer electromagnetic assembly 120A with a vertically oriented magnet 164A and a vertically oriented electromagnet 165A of the inner electromagnetic assembly 120B. Similar to the first outer pole piece 121B, the second outer pole piece 122B facilitates a magnetic connection between a vertically oriented magnet 164A and a vertically oriented electromagnet 165A with a horizontally oriented magnet 164B and a horizontally oriented electromagnet 165B of the inner electromagnetic assembly 120B. The second inner pole piece 122A completes the magnetic circuit on an inside of the inner electromagnetic assembly 120B, and an upper pole piece 129 similarly completes the magnetic circuit on an outside of the outer electromagnetic assembly 120A. Pole pieces 129, 121A, 121B, 122A and 122B serve to force the magnets 154A, 154B, 164A and 164B and the electromagnets 155A, 155B, 165A, and 165B into magnetic alignment with the pole pieces 129, 121A, 121B, 122A and 122B, thus improving uniformity of the electromagnetic field induced by the electromagnetic assembly 120. Referring directly to FIG. 6, electromagnet 155A and 155B of the plurality of electromagnets 155 of the outer electromagnet assembly 120A defines a conductive wire 156 wrapped in a coil configuration around a ferromagnetic core 157 such that the conductive wire 156 and ferromagnetic core 157 act according to electromagnetic induction when current is applied to a conductive wire 156. Power is delivered to each electromagnet 155A and 155B by the power feedthrough 179 (FIG. 2). One or more power delivery wires (not shown) or other conductive elements, which individually terminate in each electromagnet 155A and 155B, are passed through the power aperture 136 to the power feedthrough 179 (FIG. 2), thus routing power from the power feedthrough 179 (FIG. 2) to each individual electromagnet 155A and 155B through the power aperture 136 defined by the outer electromagnetic assembly 120A. An amount of power delivered to each electromagnet 155A and 155B can be individually modulated by an external controller (not shown) while the batch process chamber is under high vacuum, thus allowing continuous adjustment of the electromagnetic field during operation. In some embodiments, each of the magnets 154A and 154B is a permanent magnet.

Figure 11:
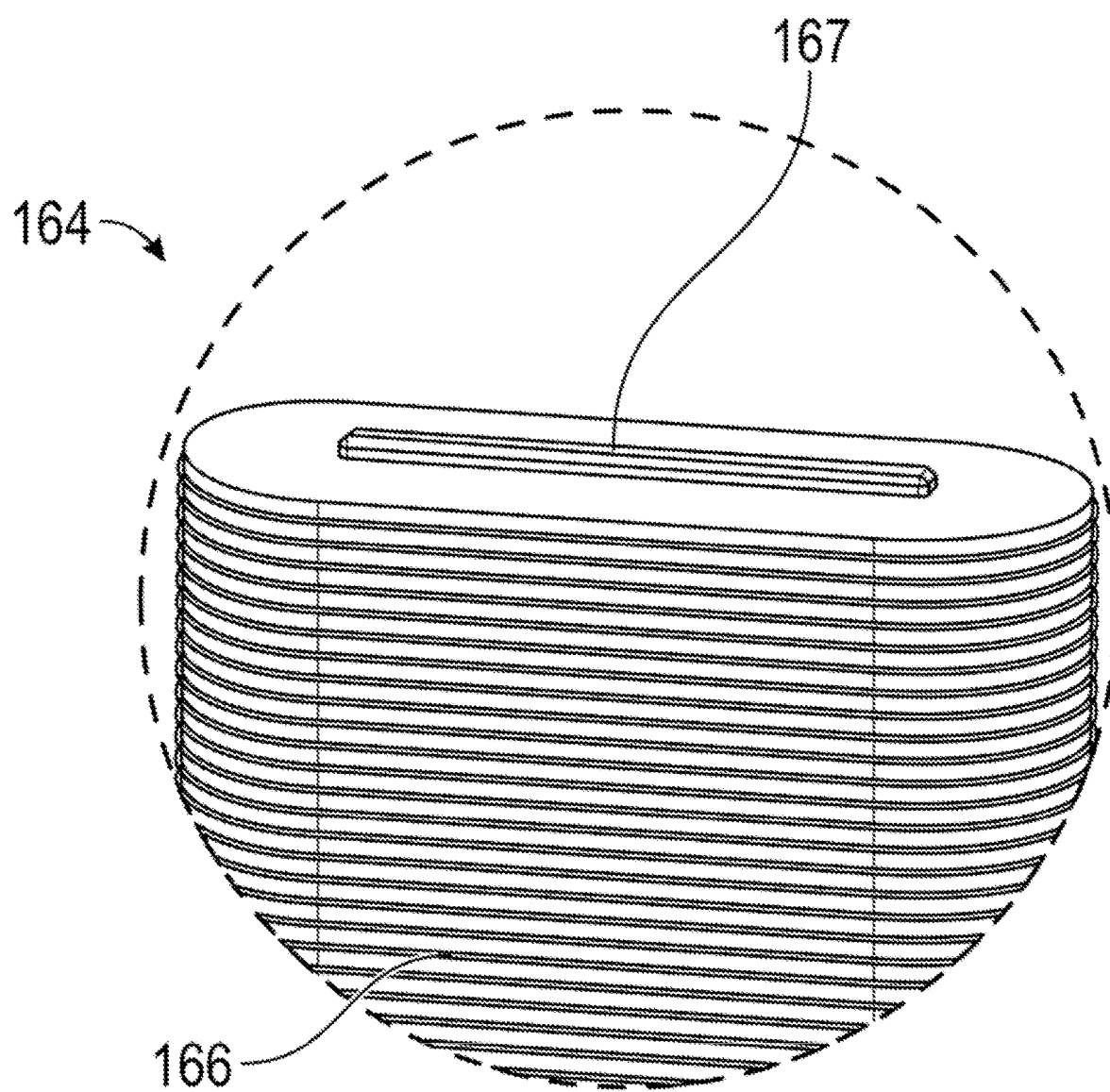
FIG. 11 is a close-up view of an electromagnet taken along circle 11 of FIG. 9.

Similarly, referring directly to FIG. 11, each electromagnet 165A and 165B of the plurality of electromagnets 165 of the outer electromagnet assembly 120B defines a conductive wire 166 wrapped in a coil configuration around a ferromagnetic core 167 such that the conductive wire 166 and ferromagnetic core 167 act according to electromagnetic induction when current is applied to each conductive wire 166. Power is delivered to each electromagnet 165A and 165B (FIG. 9) by the power feedthrough 179 (FIG. 2). One or more power delivery wires (not shown) or other conductive elements, which individually terminate in each electromagnet 165A and 165B, are passed through the power aperture 136 to the power feedthrough 179 (FIG. 2), thus routing power from the power feedthrough 179 to each individual electromagnet 165A and 165B through a power aperture 137 defined by the inner electromagnetic assembly 120B. An amount of power delivered to each electromagnet 165A and 165B can be individually modulated by an external controller (not shown) while the batch process chamber is under high vacuum, thus allowing continuous adjustment of the electromagnetic field during operation. In some embodiments, each magnet 164A and 164B is a permanent magnet.

Referring to FIGS. 3 and 4, the water jacket assembly 140 includes an outer water jacket 140A for cooling the outer electromagnetic assembly 120A and an inner water jacket 140B for cooling the inner electromagnetic assembly 120B. The outer water jacket 140A defines an outer water jacket wall 141A formed circumferentially around an outer water jacket plane 143A. The outer water jacket wall 141A includes an outer channel (not shown) in fluid flow communication with an inlet tube 147A and an outlet tube 146A with the inlet tube 147A and the outlet tube 146A respectively terminating in an inlet port 145A and an outlet port 144A. The outer channel follows along the circumference of the outer water jacket wall 141A, thereby allowing water, or another heat transfer fluid suitable for high performance liquid cooling applications, to envelop the outer electromagnetic assembly 120A and absorb heat. The outer water jacket plane 143A rests atop the plurality of horizontally oriented magnets 154B of the outer electromagnetic assembly 120A. Referring to FIG. 4, an outer back plate 138 is engaged with the outer water jacket 140A for improved stability.

Similarly, referring to FIGS. 4 and 5, the inner water jacket 140B defines an inner water jacket wall 141B circumferentially formed around an inner water jacket plane 143B. The inner water jacket wall 141B includes an inner channel (not shown) in fluid flow communication with an inlet tube 147B and an outlet tube 146B with the inlet tube 147B and the outlet tube 146B respectively terminating in an inlet port 145B and an outlet port 144B. The inner channel follows the circumference of the inner water jacket wall 141B, allowing water, or another heat transfer fluid suitable for high performance liquid cooling applications, to envelop the inner electromagnetic assembly 120B and absorb heat. The water jacket plane 143B rests atop the plurality of horizontally oriented magnets 164B of the inner electromagnetic assembly 120B. Referring to FIG. 4, an inner back plate 139 is engaged with the outer water jacket 140A for improved stability. In some embodiments, components of the water jacket 140 are of a thermally conductive but non-ferromagnetic material such as copper in order to maximize heat transfer from the electromagnet assembly 120 to water stored in the outer and inner channels (not shown) while having a minimal effect on the electromagnetic field generated within the batch processing chamber by the magnetron 100. In some embodiments, the water jacket 140 includes a coating of ceramic or another thermally and/or electrically insulating material.

Figure 12:
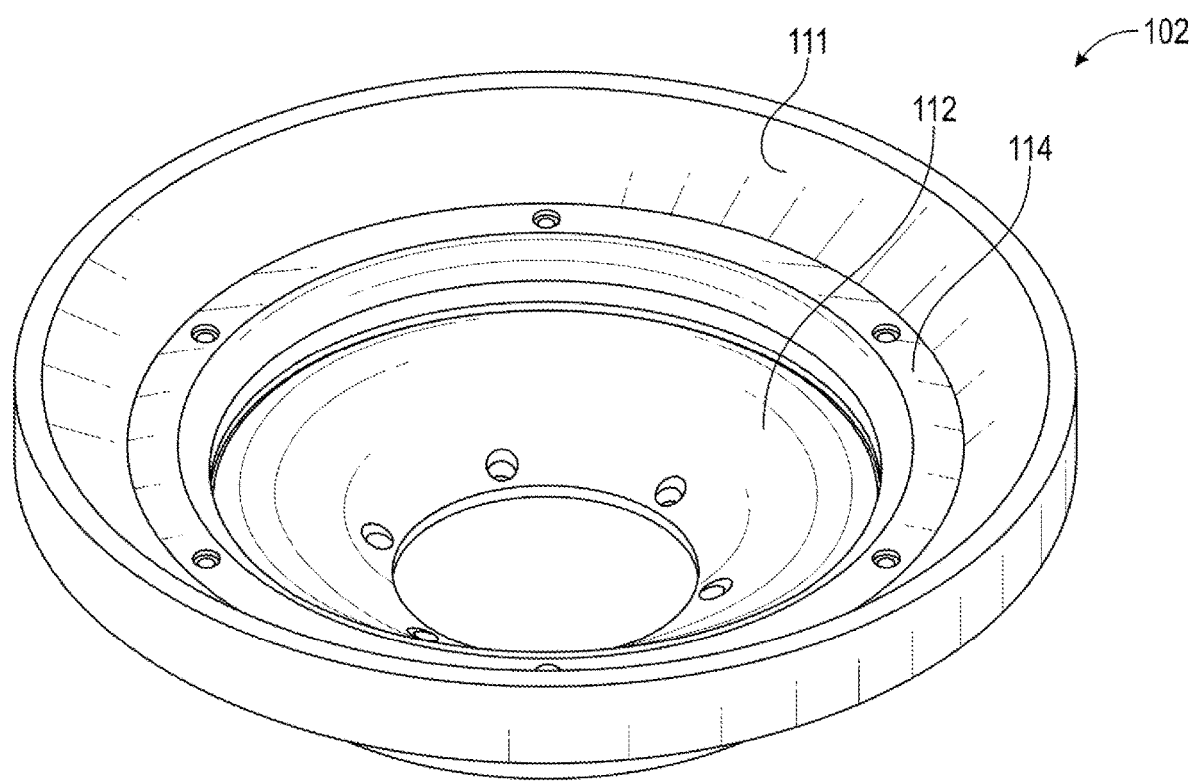
FIG. 12 is a perspective view of a sputtering target of the magnetron system of FIG. 1.

Referring to FIG. 12, the sputtering target 102 includes an outer target 111 and an inner target 112, and in some embodiments the sputtering target 102 is negatively charged. When in use within a wafer processing chamber, positively charged gas ions are attracted towards the negatively charged outer target 111 and inner target 112. Specifically, the positively charged gas ions are attracted to the sputtering target 102 by the electrons confined at the respective surfaces of the outer target 111 and the inner target 112 by the electromagnetic field generated by the electromagnetic assembly 120. This causes material from the outer target 111 and the inner target 112 to be ejected from their respective surfaces by the positively charged gas ions and adhere to an electronic wafer (not shown) within the wafer processing chamber.

To deposit an aluminum nitride (AlN) film onto the electronic wafer, the outer target 111 and the inner target 112 are comprised of aluminum. In another aspect, the outer target 111 and the inner target 112 are each comprised of a plurality of segments (not shown) such that alternative materials can be introduced (i.e., scandium) for doping purposes. In some embodiments, the outer target 111 and the inner target 112 are separated by or otherwise electrically isolated from each other by an annular target shield 114. The annular target shield 114 is located between the outer target 111 and the inner target 112 to provide structural support and/or electrical isolation.

Figure 13:
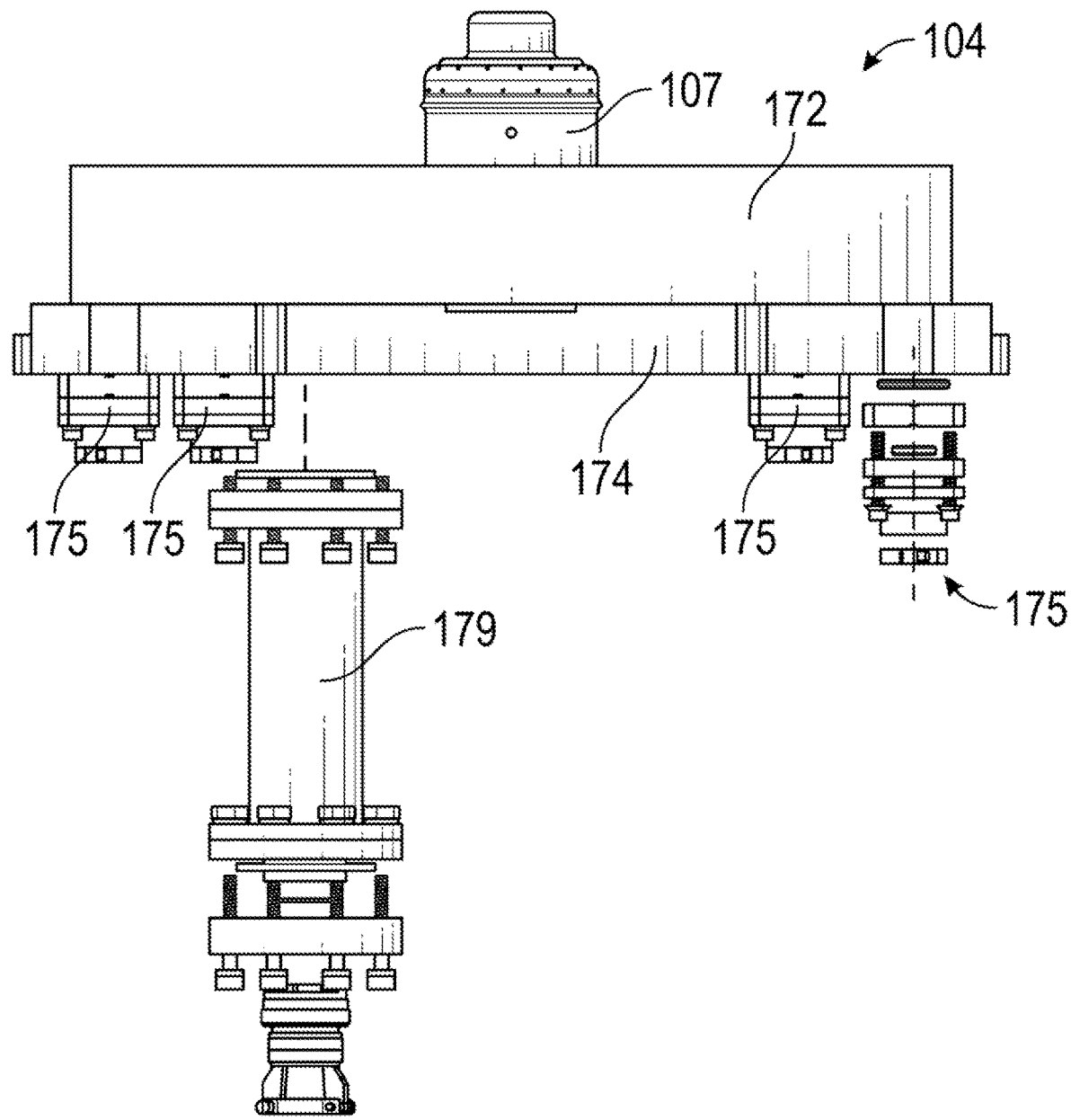
FIG. 13 is a partially exploded view of a base assembly including a power feedthrough of the magnetron system of FIG. 1.
Figure 14:
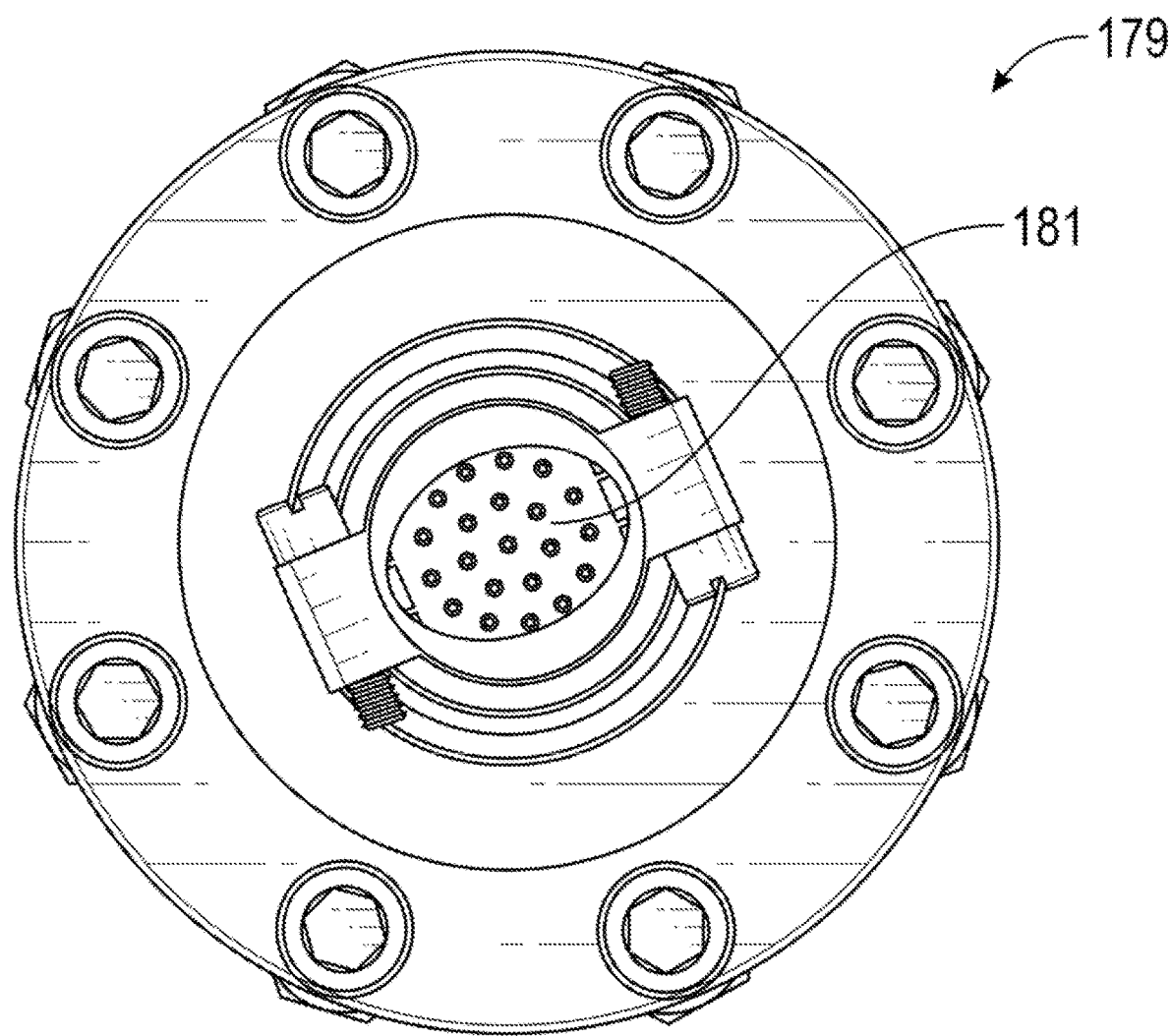
FIG. 14 is a bottom view of the power feedthrough of FIG. 13.

As shown in FIG. 13, the baseplate assembly 104 defines a planar base portion 174 and a housing portion 172 extending upward from the planar base portion 174. The baseplate assembly 104 further includes the gas tower 107 for introduction of gas into the batch process chamber. The gas tower 107 is in fluid flow communication with the gas assembly 190 of FIG. 1. In some embodiments, the inlet tubes 146A and 146B and outlet tubes 147A and 147B of the water jacket 140 (FIG. 4) are disposed through the baseplate assembly 104 and supported by water jacket feedthroughs 175. Further, the power feedthrough 172 is engaged with an underside of the baseplate assembly 104 for providing power to the electromagnetic assembly 120 (FIG. 3). An underside of the power feedthrough 179 including a power port 181 for introducing power from an external source to the power feedthrough 179 is shown in FIG. 14.

In some embodiments, power delivery to the electromagnetic assembly 120 (FIG. 3) is modulated by an external controller (not shown) in direct communication with the power feedthrough 179. For instance, power can be applied to each individual electromagnet pair 155 and 165 and each magnet pair 154 and 164 (FIGS. 5 and 8), and in some embodiments each individual vertical and horizontal electromagnet 155A, 155B, 165A and 165B and each individual vertical and horizontal magnet 154A, 154B, 164A and 164B (FIGS. 6 and 9), to modulate aspects of the magnetic field which is induced by the electromagnetic assembly 120. As discussed above, power applied to each individual electromagnet pair 155 and 165 and each magnet pair 154 and 164 has a profound effect on magnetic flux density at a surface of the sputtering target 102 due to electromagnetic induction and therefore can affect the manner in which molecules are ejected from the sputtering target 102 (FIG. 12) and can affect physical vapor deposition onto the wafer surface (not shown). As the magnetic field generated by the electromagnetic assembly 120 confines negatively charged electrons to the surface of the sputtering target 102, positively charged gas ions are accelerated towards the surface of the sputtering target 102 by their attraction to the negatively charged electrons. The ability to exert control over the magnetic field by the electromagnetic assembly 120 allows an arrangement of electrons at the surface of the sputtering target 102 to be controlled, thus further allowing control over the sputtering process.

By varying power applied to each electromagnet pair 155 and 165 and each magnet pair 154 and 164 across the plurality of electromagnet pairs 155 and 165 and the plurality of magnet pairs 154 and 164, magnetic flux density at different points across the surface of the sputtering target 102 can be controlled. Further, the power feedthrough 179 provides the ability of the magnetron 100 to transfer power from atmosphere to ultra-high vacuum, making adjustment of the electromagnetic field possible while in operation under high vacuum. This improved ability to control the magnetic flux density while under high vacuum allows precision and real-time adjustment of physical vapor deposition on the wafer surface.

TABLE 1

| Voltage | Temperature | Gauss | Gauss/Volt | Notes |
|---|---|---|---|---|
| 7 | 37 | 14 | 2.0 | |
| 14 | 64 | 27.9 | 2.0 | |
| 18 | 79 | 30.5 | 1.7 | |
| 20 | 88 | 31.6 | 1.6 | |
| 22 | 97 | 33.1 | 1.5 | Safety limit to operate |
| 24 | 106 | 33.4 | 1.4 | Resin Bulged/Cracked, coil still operational (but resin failure) |
| 29 | | 41 | 1.4 | Momentary |

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A magnetron system, comprising:

a baseplate assembly, the baseplate assembly defining a housing portion and a power feedthrough;

a sputtering target disposed within the housing portion of the baseplate assembly, the sputtering target having an axis Z, wherein the sputtering target comprises an outer target and an inner target, wherein the outer target and the inner target are electrically isolated from one another by a target shield;

an electromagnetic assembly, the electromagnetic assembly being disposed within the housing portion of the baseplate assembly and comprising a plurality of electromagnet pairs and a plurality of permanent magnet pairs, wherein at least one of the plurality of electromagnet pairs and at least one of the plurality of permanent magnet pairs are arranged in an alternating order such that the at least one electromagnet pair of the plurality of electromagnet pairs is juxtapositioned between two permanent magnet pairs of the plurality of permanent magnet pairs, and the at least one permanent magnet pair of the plurality of permanent magnet pairs is juxtapositioned between two electromagnet pairs of the plurality of electromagnet pairs, wherein the electromagnetic assembly comprises an outer electromagnetic assembly comprising a first grouping of the plurality of permanent magnet pairs, a first grouping of the plurality of electromagnet pairs, a first inner pole piece, and a first outer pole piece; and an inner electromagnetic assembly comprising a second grouping of the plurality of permanent magnet pairs, a second grouping of the plurality of electromagnet pairs, a second inner pole piece, and a second outer pole piece, wherein the inner electromagnetic assembly is positioned underneath the outer electromagnetic assembly;

wherein the at least one permanent magnet pair of the plurality of permanent magnet pairs having a vertical permanent magnet and a horizontal permanent magnet wherein the vertical permanent magnet being aligned with the axis Z and the horizontal permanent magnet being aligned perpendicular to the vertical permanent magnet; and wherein the at least one electromagnet pair of the plurality of electromagnet pairs having a vertical electromagnet and a horizontal electromagnet wherein the vertical electromagnet being aligned with the axis Z and the horizontal electromagnet being aligned perpendicular to the vertical electromagnet.

2. The system of claim 1, wherein the outer electromagnetic assembly is encased in resin and wherein the inner electromagnetic assembly is encased in resin.

3. The system of claim 1, further comprising:

a water jacket assembly, wherein the water jacket assembly comprises:

an outer water jacket disposed within the outer electromagnetic assembly of the electromagnetic assembly; and an inner water jacket disposed within the inner electromagnetic assembly of the electromagnetic assembly.

* * * * *